US012620974B2

(12) United States Patent
Modarres-Zadeh et al.

(10) Patent No.: US 12,620,974 B2
(45) Date of Patent: May 5, 2026

(54) STACKED RESONATORS WITH SHARED REFLECTOR LAYERS

(71) Applicant: Qorvo US, Inc., Greensboro, NC (US)

(72) Inventors: Mohammad J. Modarres-Zadeh, Longwood, FL (US); Gernot Fattinger, Sorrento, FL (US)

(73) Assignee: Qorvo US, Inc., Greensboro, NC (US)

( * ) Notice: Subject to any disclaimer, the term of this patent is extended or adjusted under 35 U.S.C. 154(b) by 345 days.

(21) Appl. No.: 18/337,535

(22) Filed: Jun. 20, 2023

(65) Prior Publication Data

US 2023/0412147 A1     Dec. 21, 2023

Related U.S. Application Data

(60) Provisional application No. 63/353,709, filed on Jun. 20, 2022.

(51) Int. Cl.
| | |
|---|---|
| *H03H 9/58* | (2006.01) |
| *H03H 9/13* | (2006.01) |
| *H03H 9/17* | (2006.01) |
| *H03H 9/205* | (2006.01) |

(52) U.S. Cl.
CPC ............ *H03H 9/584* (2013.01); *H03H 9/131* (2013.01); *H03H 9/178* (2013.01); *H03H 9/205* (2013.01); *H03H 9/589* (2013.01)

(58) Field of Classification Search
CPC ........ H03H 9/205; H03H 9/131; H03H 9/584; H03H 9/589; H03H 9/605; H03H 9/568

USPC .......................................... 333/187, 189, 191
See application file for complete search history.

(56) References Cited

U.S. PATENT DOCUMENTS

| | | | | |
|---|---|---|---|---|
| 8,198,958 B1 * | 6/2012 | Aigner | ................... | H03H 9/585 |
| | | | | 333/191 |
| 2007/0035364 A1 * | 2/2007 | Sridhar | ................... | H03H 9/584 |
| | | | | 333/191 |
| 2008/0309432 A1 * | 12/2008 | Fattinger | ................... | H03H 3/04 |
| | | | | 29/25.35 |
| 2022/0131521 A1 * | 4/2022 | Yusuf | ....................... | H03H 9/13 |

* cited by examiner

*Primary Examiner* — Andrea Lindgren Baltzell
*Assistant Examiner* — Victor Cole
(74) *Attorney, Agent, or Firm* — Withrow & Terranova, P.L.L.C.

(57) ABSTRACT

The present disclosure relates to a resonator structure including stacked resonators, which share a same reflector. The disclosed resonator structure includes a first resonator and a second resonator, which is vertically stacked with the first resonator and shares a common reflector with the first resonator. Herein, the first resonator is at least composed of a first top electrode, a first piezoelectric layer underneath the first top electrode, and the common reflector underneath the first piezoelectric layer. The second resonator is at least composed of the common reflector, a second piezoelectric layer underneath the common reflector, and a second bottom electrode underneath the second piezoelectric layer. The first resonator and the second resonator are acoustically isolated from each other.

19 Claims, 8 Drawing Sheets

STACKED RESONATORS WITH SHARED REFLECTOR LAYERS

RELATED APPLICATIONS

This application claims the benefit of provisional patent application Ser. No. 63/353,709, filed Jun. 20, 2022, the disclosure of which is hereby incorporated herein by reference in its entirety.

FIELD OF THE DISCLOSURE

The present disclosure relates to a resonator structure including stacked resonators, which share a same reflector.

BACKGROUND

Due to, among other things, their small size, high Q values, and very low insertion losses at microwave frequencies, particularly those above 1.5 Gigahertz (GHz), Bulk Acoustic Wave (BAW) resonators are widely used in many wireless communications devices. In particular, for many 3rd Generation (3G) and 4th Generation (4G) wireless devices, BAW resonators are used in filters to improve reception and transmission of signals.

One example of a conventional solid mount BAW resonator (SMR) 100 is illustrated in FIG. 1. The SMR 100 is formed by sandwiching a piezoelectric layer 102 between a top reflector 104 and a bottom reflector 106. The top reflector 104 and the bottom reflector 106 are configured to keep the energy in the piezoelectric layer 102. Due to acoustic reasons (e.g., achieving different temperature coefficient frequency) or packaging reasons, the SMR 100 may only have one of the top and bottom reflectors 104 and 106. In addition, the SMR 100 also includes a top electrode 108 residing vertically between the piezoelectric layer 102 and the top reflector 104 and a bottom electrode 110 residing vertically between the piezoelectric layer 102 and the bottom reflector 106. The top electrode 108 and the bottom electrode 110 are used to electrically connect to external components. The SMR 100 may also include a substrate 112 underneath the bottom reflector 106.

Typically, one device die may only accommodate one SMR 100, which has one piezoelectric coefficient (e.g., the piezoelectric layer 102 is formed of one piezoelectric material with one piezoelectric coefficient/electromechanical coupling coefficient Ke2). To implement a BAW filter with both series resonators and shunt resonators will consume a significant device area.

Accordingly, there remains a need for improved resonator designs to achieve more than one piezoelectric coefficient without suffering a bulk volume of the final product. Further, there is also a need to keep the final product easy to implement and cost effective.

SUMMARY

The present disclosure relates to a resonator structure including stacked resonators, which share a same reflector. The disclosed resonator structure includes a first resonator and a second resonator, which is vertically stacked with the first resonator and shares a common reflector with the first resonator. Herein, the first resonator is at least composed of a first top electrode, a first piezoelectric layer underneath the first top electrode, and the common reflector underneath the first piezoelectric layer. The second resonator is at least composed of the common reflector, a second piezoelectric layer underneath the common reflector, and a second bottom electrode underneath the second piezoelectric layer. The first resonator and the second resonator are acoustically isolated from each other.

In one embodiment of the resonator structure, the common reflector is a conductive reflector, such that the first resonator and the second resonator are electrically connected without external wiring.

In one embodiment of the resonator structure, the first resonator further includes a first bottom electrode residing vertically between the common reflector and the first piezoelectric layer, while the second resonator further includes a second top electrode residing vertically between the common reflector and the second piezoelectric layer. The common reflector includes top common vias, bottom common vias, a top common dielectric layer, a bottom common dielectric layer underneath the top common dielectric layer, and alternating high acoustic impedance layers and low acoustic impedance layers residing vertically between the top common dielectric layer and the bottom common dielectric layer. Each of the top common vias extends through the top common dielectric layer and electrically connects the first bottom electrode and a top one of the high acoustic impedance layers. Each of the bottom common vias extends through the bottom common dielectric layer and electrically connects the second top electrode and a bottom one of the high acoustic impedance layers.

In one embodiment of the resonator structure, the top common dielectric layer and the bottom common dielectric layer are formed of silicon oxide ($SiO_2$). The high acoustic impedance layers are formed of tungsten (W), molybdenum (Mo), or platinum (Pt), and the low acoustic impedance layers are formed of aluminum (Al).

In one embodiment of the resonator structure, the common reflector is a non-conductive reflector, and the first resonator and the second resonator are electrically connected with external wiring.

In one embodiment of the resonator structure, the first resonator further includes a first bottom electrode residing vertically between the common reflector and the first piezoelectric layer, while the second resonator further includes a second top electrode residing vertically between the common reflector and the second piezoelectric layer. The common reflector includes alternating high acoustic impedance layers and low acoustic impedance layers residing vertically between the first bottom electrode and the second top electrode.

In one embodiment of the resonator structure, the high acoustic impedance layers are formed of W, Mo, or Pt, and the low acoustic impedance layers are formed of $SiO_2$. A total number of the alternating high acoustic impedance layers and low acoustic impedance layers is at least five.

In one embodiment of the resonator structure, the first resonator further includes a top reflector over the first top electrode.

In one embodiment of the resonator structure, the second resonator further includes a bottom reflector underneath the second bottom electrode.

In one embodiment of the resonator structure, the top reflector is a conductive reflector and includes top vias, a top dielectric layer over the first top electrode, and alternating first high acoustic impedance layers and first low acoustic impedance layers over the top dielectric layer. Each of the top vias extends through the top dielectric layer and electrically connects the first top electrode and a bottom one of the first high acoustic impedance layers.

In one embodiment of the resonator structure, the bottom reflector is a conductive reflector and includes bottom vias, a bottom dielectric layer underneath the second bottom electrode, and alternating second high acoustic impedance layers and second low acoustic impedance layers underneath the bottom dielectric layer. Each of the bottom vias extends through the bottom dielectric layer and electrically connects the second bottom electrode and a top one of the second high acoustic impedance layers.

In one embodiment of the resonator structure, the top dielectric layer and the bottom dielectric layer are formed of $SiO_2$. The first high acoustic impedance layers and the second high acoustic impedance layers are formed of W, Mo, or Pt. The first low acoustic impedance layers and the second low acoustic impedance layers are formed of Al.

In one embodiment of the resonator structure, the top reflector is a non-conductive reflector and includes alternating first high acoustic impedance layers and first low acoustic impedance layers over the first top electrode.

In one embodiment of the resonator structure, the bottom reflector is a non-conductive reflector and includes alternating second high acoustic impedance layers and second low acoustic impedance layers underneath the second bottom electrode.

In one embodiment of the resonator structure, the first high acoustic impedance layers and the second high acoustic impedance layers are formed of W, Mo, or Pt. The first low acoustic impedance layers and the second low acoustic impedance layers are formed of $SiO_2$. A total number of the alternating first high acoustic impedance layers and first low acoustic impedance layers is at least five. A total number of the alternating second high acoustic impedance layers and second low acoustic impedance layers is at least five.

In one embodiment of the resonator structure, the first piezoelectric layer and the second piezoelectric layer are formed of different materials.

According to one embodiment, the resonator structure further comprises a third resonator, which is vertically stacked with the first resonator and the second resonator, and shares a second common reflector with the second resonator. Herein, the second resonator is at least composed of the common reflector, the second piezoelectric layer underneath the common reflector, the second bottom electrode underneath the second piezoelectric layer, and the second common reflector underneath the second bottom electrode. The third resonator is at least composed of the second common reflector, a third piezoelectric layer underneath the second common reflector, and a third bottom electrode underneath the third piezoelectric layer. The first resonator, the second resonator, and the third resonator are acoustically isolated from each other.

In another aspect, any of the foregoing aspects individually or together, and/or various separate aspects and features as described herein, may be combined for additional advantage. Any of the various features and elements as disclosed herein may be combined with one or more other disclosed features and elements unless indicated to the contrary herein.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

Figure 1:
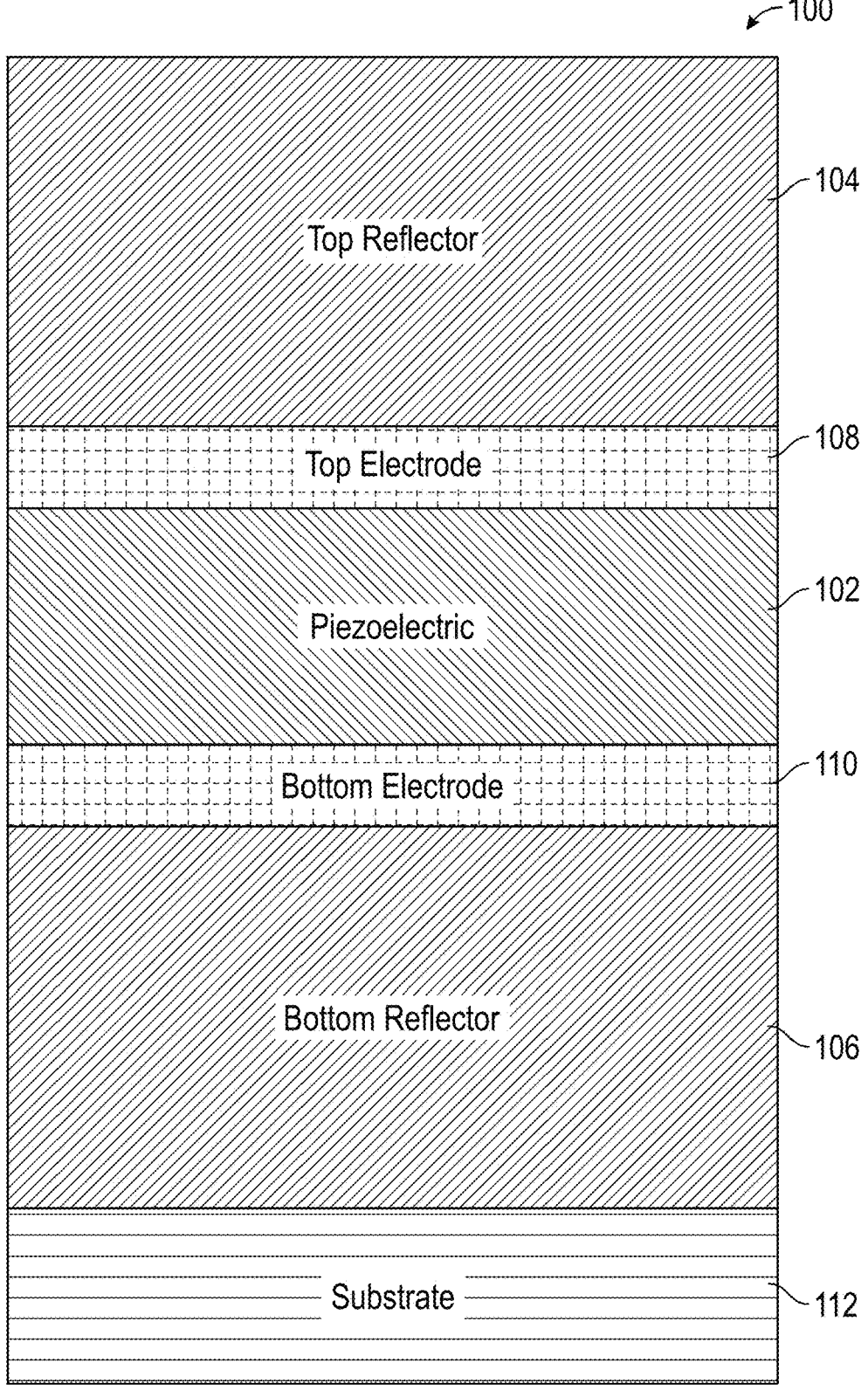
FIG. 1 illustrates a cross-section view of a conventional solid mount Bulk Acoustic Wave (BAW) resonator (SMR).

It will be understood that for clear illustrations, FIGS. 1-5B may not be drawn to scale.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments are described herein with reference to schematic illustrations of embodiments of the disclosure. As such, the actual dimensions of the layers and elements can be different, and variations from the shapes of the illustrations as a result, for example, of manufacturing techniques and/or tolerances, are expected. For example, a region illustrated or described as square or rectangular can have rounded or curved features, and regions shown as straight lines may have some irregularity. Thus, the regions illustrated in the figures are schematic and their shapes are not intended to illustrate the precise shape of a region of a device and are not intended to limit the scope of the disclosure. Additionally, sizes of structures or regions may be exaggerated relative to other structures or regions for illustrative purposes and, thus, are provided to illustrate the general structures of the present subject matter and may or may not be drawn to scale. Common elements between figures may be shown herein with common element numbers and may not be subsequently re-described.

Figure 2A:
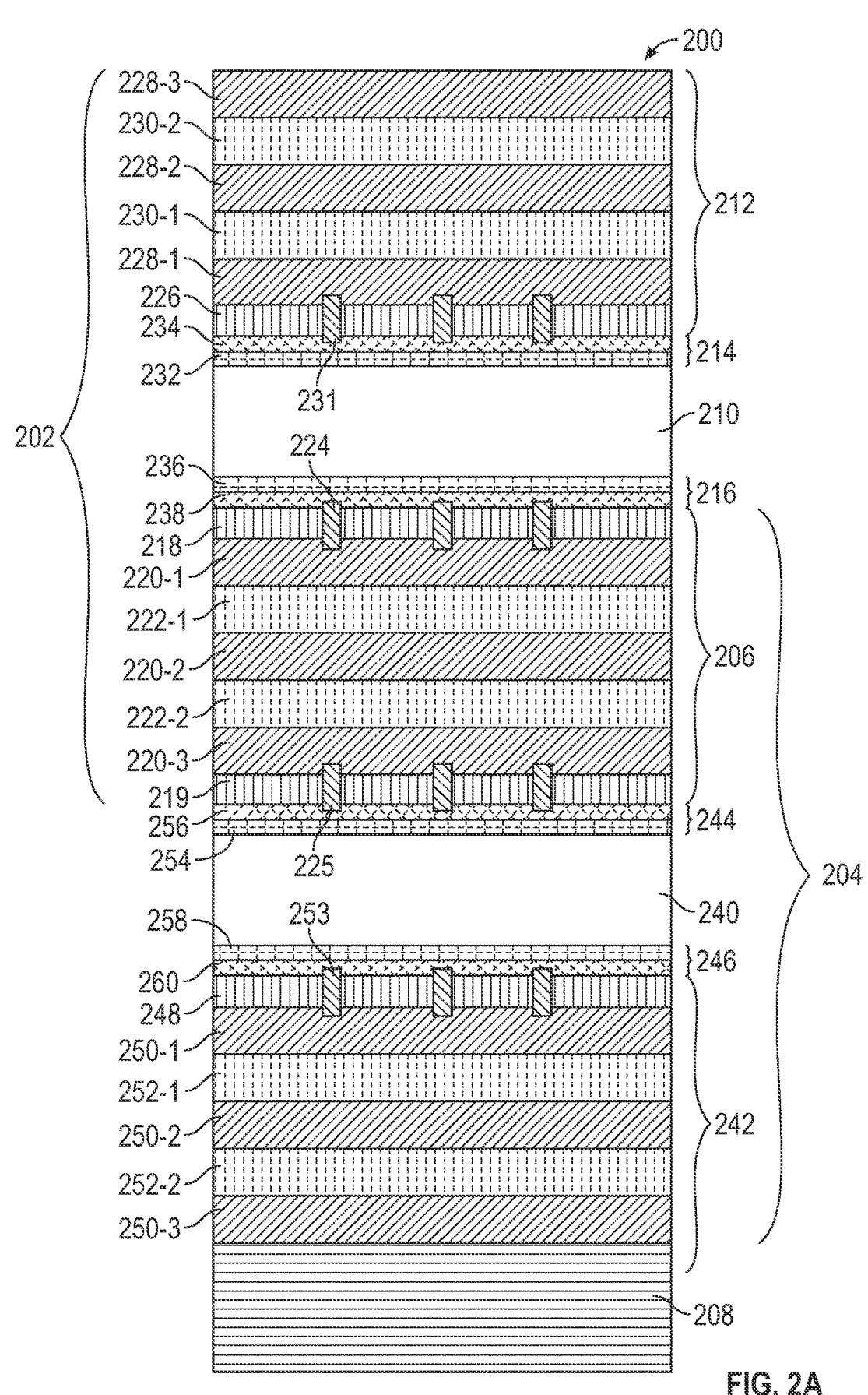
FIGS. 2A and 2B illustrate an exemplary resonator structure, which includes two stacked resonators sharing a same reflector according to some embodiments of the present disclosure.
Figure 2B:
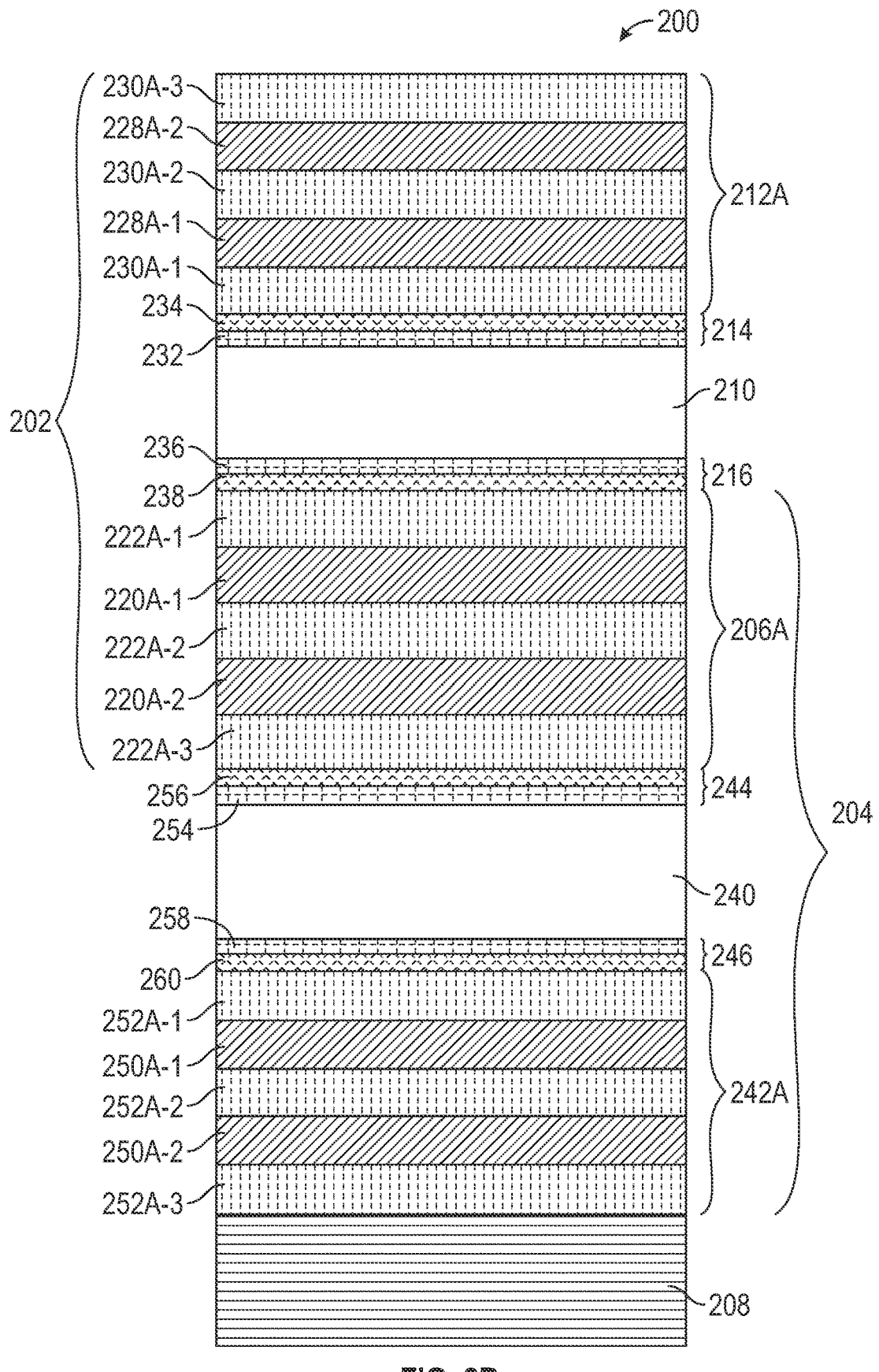

FIGS. 2A and 2B illustrate an exemplary resonator structure 200, which includes stacked resonators sharing a same reflector according to some embodiments of the present disclosure. The resonator structure 200 includes a first resonator 202 and a second resonator 204, which are vertically stacked with each other and share a common reflector 206. Both the first resonator 202 and the second resonator 204 reside on a substrate 208, which is formed of silicon (Si).

As illustrated in FIG. 2A, the first resonator 202 is composed of a first piezoelectric layer 210, the common reflector 206, a top reflector 212, a first top electrode 214, and a first bottom electrode 216. The first bottom electrode 216 resides over the common reflector 206, the first piezoelectric layer 210 resides over the first bottom electrode 216, the first top electrode 214 resides over the first piezoelectric layer 210, and the top reflector 212 resides over the first top electrode 214. In one embodiment, the common reflector 206 is a conductive reflector.

In detail, the common reflector 206 includes a top common dielectric layer 218 underneath the first bottom electrode 216, a bottom common dielectric layer 219, and multiple alternating reflection layers with different acoustic impedances between the top common dielectric layer 218 and the bottom common dielectric layer 219. The top common dielectric layer 218 and the bottom common dielectric layer 219 may be formed of silicon dioxide ($SiO_2$). In one embodiment, the multiple alternating reflection layers within the common reflector 206 may include common high acoustic impedance layers 220 and common low acoustic impedance layers 222, which have lower acoustic impedance, lower density, and lower stiffness than the common high acoustic impedance layers 220. The common high acoustic impedance layers 220 may be formed of tungsten (W), molybdenum (Mo), or platinum (Pt), and the common low acoustic impedance layers 222 may be formed of aluminum (Al). The bigger the differences in density and stiffness between adjacent common low and high acoustic impedance layers 220 and 222, the better the reflection behavior of the common reflector 206.

For the purpose of this illustration, the common reflector 206 includes three common high acoustic impedance layers 220 and two common low acoustic impedance layers 222 (e.g., a first common high acoustic impedance layer 220-1 underneath the top common dielectric layer 218, a first common low acoustic impedance layer 222-1 underneath the first common high acoustic impedance layer 220-1, a second common high acoustic impedance layer 220-2 underneath the first common low acoustic impedance layer 222-1, a second common low acoustic impedance layer 222-2 underneath the second common high acoustic impedance layer 220-2, a third common high acoustic impedance layer 220-3 underneath the second common low acoustic impedance layer 222-2, and the bottom common dielectric layer 219 underneath the third common high acoustic impedance layer 220-3). For different applications, the common reflector 206 may include fewer or more alternating low and high acoustic impedance layers.

In addition, the common reflector 206 may further include top common vias 224 and bottom common vias 225. Each top common via 224 extends through the top common dielectric layer 218 and electrically connects the first bottom electrode 216 and one reflection layer (e.g., the first common high acoustic impedance layer 220-1). Each bottom common via 225 extends through the bottom common dielectric layer 219 and electrically connects a second top electrode 244 of the second resonator 204 (details described below) and one reflection layer (e.g., the third common high acoustic impedance layer 220-3). As such, although the common reflector 206 includes dielectric layers 218 and 219, the common reflector 206 is still a conductive reflector. The first resonator 202 and the second resonator 204 can be electrically connected without external wiring (i.e., the first bottom electrode 216 of the first resonator 202 and the second top electrode 244 of the second resonator 204 are electrically connected through the common reflector 206).

In some applications, the first bottom electrode 216 of the first resonator 202 and the second top electrode 244 of the second resonator 204 may be omitted. For such circumstances, each of the top and bottom common dielectric layers 218 and 219 of the common reflector 206 may be replaced by a low acoustic impedance layer, such as one common low acoustic impedance layer 222 (e.g., formed of Al), while the top common vias 224 and the bottom common vias 225 of the common reflector 206 are removed (not shown). In general, when the first bottom electrode 216 of the first resonator 202 and the second top electrode 244 of the second resonator 204 are omitted, the common reflector 206 may be formed of the common high acoustic impedance layers 220 and the common low acoustic impedance layers 222 alternately, where one of the common low acoustic impedance layers 222 is directly next to the first piezoelectric layer 210/the second piezoelectric layer 240 (without dielectric layers and vias). Herein, the common reflector 206 is still conductive, and the first resonator 202 and the second resonator 204 are electrically connected. A total number of the reflection layers (220 and 222) within the common reflector 206 is at least five. For different applications, the common reflector 206 may include more alternating low and high acoustic impedance layers.

The top reflector 212 includes a top dielectric layer 226 over the first top electrode 214 and multiple alternating reflection layers with different acoustic impedances above the top dielectric layer 226. The top dielectric layer 226 may be formed of SiO$_2$. In one embodiment, the multiple alternating reflection layers within the top reflector 212 may include top high acoustic impedance layers 228 and top low acoustic impedance layers 230, which have lower acoustic impedance, lower density, and lower stiffness than the top high acoustic impedance layers 228. The top high acoustic impedance layers 228 may be formed of W, Mo, or Pt, and the top low acoustic impedance layers 230 may be formed of Al. The bigger the differences in density and stiffness between adjacent top low and high acoustic impedance layers 228 and 230, the better the reflection behavior of the top reflector 212.

For the purpose of this illustration, the top reflector 212 includes three top high acoustic impedance layers 228 and two top low acoustic impedance layers 230 (e.g., a first top high acoustic impedance layer 228-1 over the top dielectric layer 226, a first top low acoustic impedance layer 230-1 over the first top high acoustic impedance layer 228-1, a second top high acoustic impedance layer 228-2 over the first top low acoustic impedance layer 230-1, a second top low acoustic impedance layer 230-2 over the second top high acoustic impedance layer 228-2, and a third top high acoustic impedance layer 228-3 over the second top low acoustic impedance layer 230-2.) For different applications, the top reflector 212 may include fewer or more alternating low and high acoustic impedance layers. The number of the alternating low and high acoustic impedance layers within the top reflector 212 and the number of the alternating low and high acoustic impedance layers within the common reflector 206 may be different or the same.

In addition, the top reflector 212 may further include top vias 231. Each top via 231 extends through the top dielectric layer 226 and electrically connects the first top electrode 214 and one reflection layer (e.g., the first top high acoustic impedance layer 228-1). As such, although the top reflector 212 includes the top dielectric layer 226, the top reflector 212 can be a conductive reflector. In some applications, the top vias 231 are omitted within the top reflector 212.

The first piezoelectric layer 210 may be formed of a piezoelectric material, such as aluminum nitride (AlN), zinc oxide (ZnO), or the like. The first top electrode 214 may include two electrode layers 232 and 234. The first electrode layer 232 is over the piezoelectric layer 210 and is formed of W, Mo, or Pt, while the second electrode layer 234 is over the first electrode layer 232 and is formed of Al. The top reflector 212 (i.e., the top dielectric layer 226 of the top reflector 212) is over the second electrode layer 234. If the top reflector 212 includes the top vias 231, each top via 231 extends through the top dielectric layer 226 and electrically connects the second electrode layer 234 of the first top electrode 214 and the first top high acoustic impedance layer 228-1. The first bottom electrode 216 may also include two electrode layers 236 and 238. The first electrode layer 236 is underneath the piezoelectric layer 210 and is formed of W, Mo, or Pt, while the second electrode layer 238 is underneath the first electrode layer 236 and is formed of Al. The common reflector 206 (i.e., the top common dielectric layer 218 of the common reflector 206) is underneath the second electrode layer 238. If the common reflector 206 includes the top common vias 224, each top common via 224 extends through the top common dielectric layer 218 and electrically connects the second electrode layer 238 of the first bottom electrode 216 and the first common high acoustic impedance layer 220-1.

Similar to the first resonator 202, the second resonator 204 is composed of a second piezoelectric layer 240, the common reflector 206, a bottom reflector 242, the second top electrode 244, and a second bottom electrode 246. The second top electrode 244 resides underneath the common reflector 206, the second piezoelectric layer 240 resides underneath the second top electrode 244, the second bottom electrode 246 resides underneath the second piezoelectric layer 240, the bottom reflector 242 resides underneath the second bottom electrode 246, and the substrate 208 resides underneath the bottom reflector 242.

In detail, the bottom reflector 242 includes a bottom dielectric layer 248 underneath the second bottom electrode 246 and multiple alternating reflection layers with different acoustic impedances underneath the bottom dielectric layer 248. The bottom dielectric layer 248 may be formed of SiO$_2$. In one embodiment, the multiple alternating reflection layers within the bottom reflector 242 may include bottom high acoustic impedance layers 250 and bottom low acoustic impedance layers 252, which have lower acoustic impedance, lower density, and lower stiffness than the bottom high acoustic impedance layers 250. The bottom high acoustic impedance layers 250 may be formed of W, Mo, or Pt, and the bottom low acoustic impedance layers 252 may be formed of Al. The bigger the differences in density and stiffness between adjacent top low and high acoustic impedance layers 250 and 252, the better the reflection behavior of the bottom reflector 242.

For the purpose of this illustration, the bottom reflector 242 includes three bottom high acoustic impedance layers 250 and two bottom low acoustic impedance layers 252 (e.g., a first bottom high acoustic impedance layer 250-1 underneath the bottom dielectric layer 248, a first bottom low acoustic impedance layer 252-1 underneath the first bottom high acoustic impedance layer 250-1, a second bottom high acoustic impedance layer 250-2 underneath the first bottom low acoustic impedance layer 252-1, a second bottom low acoustic impedance layer 252-2 underneath the second bottom high acoustic impedance layer 250-2, a third bottom high acoustic impedance layer 250-3 underneath the second bottom low acoustic impedance layer 252-2, and the substrate 208 underneath the third bottom high acoustic impedance layer 250-3). For different applications, the bottom reflector 242 may include fewer or more alternating low and high acoustic impedance layers. The number of the alternating low and high acoustic impedance layers within the bottom reflector 242, the number of the alternating low and high acoustic impedance layers within the common reflector 206, and the number of the alternating low and high acoustic impedance layers within the top reflector 212 may be different or the same.

In addition, the bottom reflector 242 may further include bottom vias 253. Each bottom via 253 extends through the bottom dielectric layer 248 and electrically connects the second bottom electrode 246 and one reflection layer (e.g., the first bottom high acoustic impedance layer 250-1). As such, although the bottom reflector 242 includes the bottom dielectric layer 248, the bottom reflector 242 can be a conductive reflector. In some applications, the bottom vias 253 are omitted within the bottom reflector 242.

The second piezoelectric layer 240 may be formed of a piezoelectric material, such as AlN, ZnO, or the like. The second top electrode 244 may include two electrode layers 254 and 256. The first electrode layer 254 is over the second piezoelectric layer 240 and is formed of W, Mo, or Pt, while the second electrode layer 256 is over the first electrode layer 254 and is formed of Al. The common reflector 206 (i.e., the bottom common dielectric layer 219 of the common reflector 206) is over the second electrode layer 256. If the common reflector 206 includes the bottom common vias 225, each bottom common via 225 extends through the bottom common dielectric layer 219 and electrically connects the second electrode layer 256 of the second top electrode 244 and the third common high acoustic impedance layer 220-3. The second bottom electrode 246 may also include two electrode layers 258 and 260. The first electrode layer 258 is underneath the second piezoelectric layer 240 and is formed of W, Mo, or Pt, while the second electrode layer 260 is underneath the first electrode layer 258 and is formed of Al. The bottom reflector 242 (i.e., the bottom dielectric layer 248 of the bottom reflector 242) is underneath the second electrode layer 260. If the bottom reflector 242 includes the bottom vias 253, each bottom via 253 extends through the bottom dielectric layer 248 and electrically connects the second electrode layer 260 of the second bottom electrode 246 and the first bottom high acoustic impedance layer 250-1.

Notice that in the resonator structure 200, the first resonator 202 and the second resonator 204 are vertically stacked and share the common reflector 206. As such, compared to two individual SMRs (e.g., the SMR 100), the resonator structure 200 significantly saves device areas. In addition, the first piezoelectric layer 210 of the first resonator 202 and the second piezoelectric layer 240 of the second resonator 204 may be formed of different piezoelectric materials. For a non-limited example, the first piezoelectric layer 210 is formed of AlN, while the second piezoelectric layer 240 is formed of ZnO. As such, within one device die (i.e., within the resonator structure 200), two piezoelectric properties can be achieved.

For some embodiments, the first resonator 202 and the second resonator 204 include non-conductive reflectors instead of conductive reflectors. As illustrated in FIG. 2B, the first resonator 202 includes an alternative top reflector 212A instead of the top reflector 212, the second resonator 204 includes an alternative bottom reflector 242A instead of the bottom reflector 242, and the first resonator 202 and the second resonator 204 share an alternative common reflector 206A instead of the common reflector 206. The alternative top reflector 212A, the alternative bottom reflector 242A, and the alternative common reflector 206A are located at the same positions as the top reflector 212, the bottom reflector 242, and the common reflector 206, respectively, in the resonator structure 200.

In detail, the alternative common reflector 206A includes multiple alternating reflection layers with different acoustic impedances between the first bottom electrode 216 of the first resonator 202 and the second top electrode 244 of the second resonator 204. Herein, the multiple alternating reflection layers within the alternative common reflector 206A may include alternative common high acoustic impedance layers 220A and alternative common low acoustic impedance layers 222A, which have lower acoustic impedance, lower density, and lower stiffness than the alternative common high acoustic impedance layers 220A. The alternative common high acoustic impedance layers 220A may be formed of W, Mo, or Pt, and the alternative common low acoustic impedance layers 222A may be formed of $SiO_2$. The alternative common reflector 206A as a whole is not conductive, such that external wiring is needed for electrically connecting the first resonator 202 with the second resonator 204.

For the purpose of this illustration, the alternative common reflector 206A includes two alternative common high acoustic impedance layers 220A and three alternative common low acoustic impedance layers 222A (e.g., a first alternative common low acoustic impedance layer 222A-1 underneath the first bottom electrode 216, a first alternative common high acoustic impedance layer 220A-1 underneath the first alternative common low acoustic impedance layer 222A-1, a second alternative common low acoustic impedance layer 222A-2 underneath the first alternative common high acoustic impedance layer 220A-1, a second alternative common high acoustic impedance layer 220A-2 underneath the second alternative common low acoustic impedance layer 222A-2, a third alternative common low acoustic impedance layer 222A-3 underneath the second alternative common high acoustic impedance layer 220A-2, and the second top electrode 244 underneath the third alternative common low acoustic impedance layer 222A-3). A total number of the alternative reflection layers (220A and 222A) is at least five. For different applications, the alternative common reflector 206A may include more alternating low and high acoustic impedance layers. Notice that whether the common reflector 206 (e.g., conductive reflector) or the alternative common reflector 206A (e.g., non-conductive reflector) is utilized in the resonator structure 200, the first resonator 202 and the second resonator 204 are acoustically isolated from each other.

The alternative top reflector 212A includes multiple alternating reflection layers with different acoustic impedances above the first top electrode 214 of the first resonator 202. Herein, the multiple alternating reflection layers within the alternative top reflector 212A may include alternative top high acoustic impedance layers 228A and alternative top low acoustic impedance layers 230A, which have lower acoustic impedance, lower density, and lower stiffness than the alternative top high acoustic impedance layers 228A. The alternative top high acoustic impedance layers 228A may be formed of W, Mo, or Pt, and the alternative top low acoustic impedance layers 230A may be formed of $SiO_2$. The alternative top reflector 212A as a whole is not conductive.

For the purpose of this illustration, the alternative top reflector 212A includes two alternative top high acoustic impedance layers 228A and three alternative top low acoustic impedance layers 230A (e.g., a first alternative top low acoustic impedance layer 230A-1 over the first top electrode 214, a first alternative top high acoustic impedance layer 228A-1 over the first alternative top low acoustic impedance layer 230A-1, a second alternative top low acoustic impedance layer 230A-2 over the first alternative top high acoustic impedance layer 228A-1, a second alternative top high acoustic impedance layer 228A-2 over the second alternative top low acoustic impedance layer 230A-2, and a third alternative top low acoustic impedance layer 230A-3 over the second alternative top high acoustic impedance layer 228A-2). For different applications, the alternative top reflector 212A may include more alternating low and high acoustic impedance layers.

The alternative bottom reflector 242A includes multiple alternating reflection layers with different acoustic impedances underneath the second bottom electrode 246 of the second resonator 204. Herein, the multiple alternating reflection layers within the alternative bottom reflector 242A may include alternative bottom high acoustic impedance layers 250A and alternative bottom low acoustic impedance layers 252A, which have lower acoustic impedance, lower density, and lower stiffness than the alternative bottom high acoustic impedance layers 250A. The alternative bottom high acoustic impedance layers 250A may be formed of W, Mo, or Pt, and the alternative bottom low acoustic impedance layers 252A may be formed of $SiO_2$. The alternative bottom reflector 242A as a whole is not conductive.

For the purpose of this illustration, the alternative bottom reflector 242A includes two alternative bottom high acoustic impedance layers 250A and three alternative bottom low acoustic impedance layers 252A (e.g., a first alternative bottom low acoustic impedance layer 252A-1 underneath the second bottom electrode 246, a first alternative bottom high acoustic impedance layer 250A-1 underneath the first alternative bottom low acoustic impedance layer 252A-1, a second alternative bottom low acoustic impedance layer 252A-2 underneath the first alternative bottom high acoustic impedance layer 250A-1, a second alternative bottom high acoustic impedance layer 250A-2 underneath the second alternative bottom low acoustic impedance layer 252A-2, a third alternative bottom low acoustic impedance layer 252A-3 underneath the second alternative bottom high acoustic impedance layer 250A-2, and the substrate 208 underneath the third alternative bottom low acoustic impedance layer 252A-3). For different applications, the alternative bottom reflector 242A may include more alternating low and high acoustic impedance layers.

For some embodiments, the resonator structure 200 includes both conductive reflector(s) and non-conductive reflector(s). The first resonator 202 may include the conductive top reflector 212 or the non-conductive top reflector 212A, the second resonator 204 may include the conductive bottom reflector 242 or the non-conductive bottom reflector 242A, and the first resonator 202 and the second resonator 204 may share the conductive common reflector 206 or the non-conductive common reflector 206. For a non-limited example, the first resonator 202 includes the non-conductive top reflector 212A, the second resonator 204 includes the non-conductive bottom reflector 242A, and the first resonator 202 and the second resonator 204 share the conductive common reflector 206 (not shown).

Figure 3A:
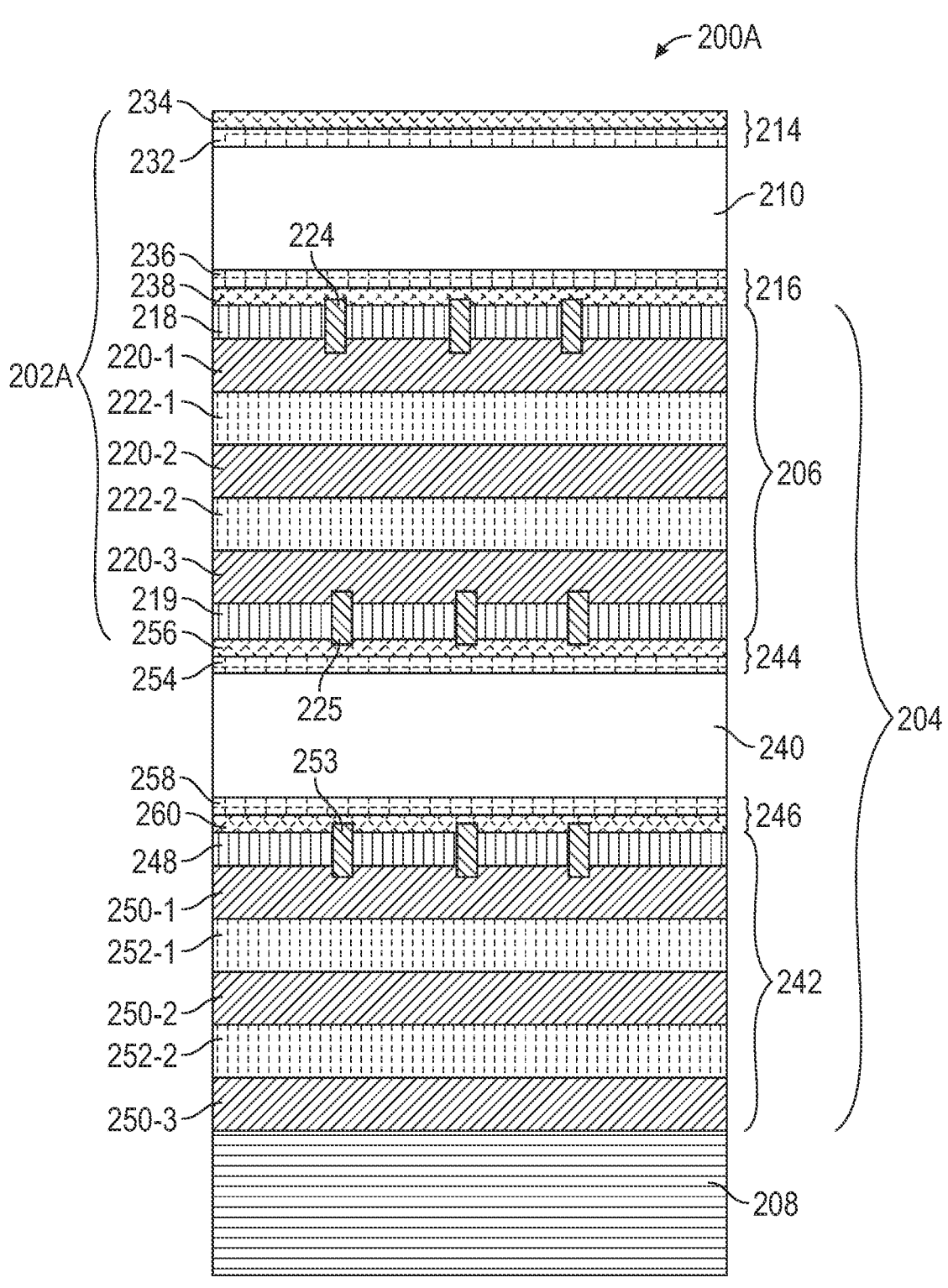
FIGS. 3A-3B illustrate an alternative resonator structure with two stacked resonators according to some embodiments of the present disclosure.
Figure 3B:
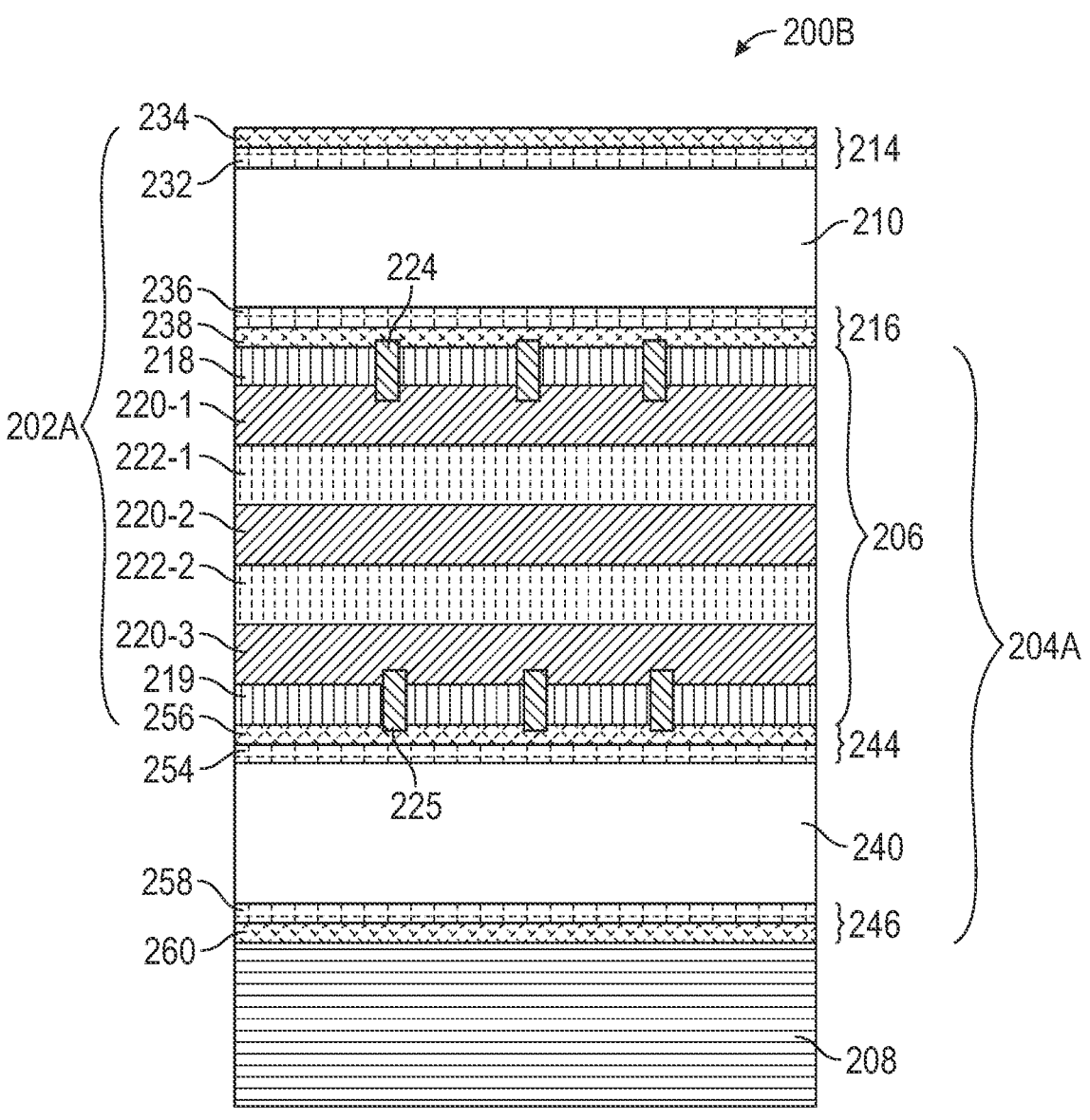

FIGS. 3A-3B illustrate an alternative resonator structure according to some embodiments of the present disclosure. Unlike the resonator structure 200, which includes three reflectors for two resonators, a first alternative resonator structure 200A only includes two reflectors for two resonators, as illustrated in FIG. 3A. The first alternative resonator structure 200A includes a first alternative resonator 202A and the second resonator 204, which are vertically stacked with each other and share the common reflector 206. Both the first alternative resonator 202A and the second resonator 204 reside on the substrate 208. Compared to the first resonator 202 in the resonator structure 200, the first alternative resonator 202A in the first alternative resonator structure 200A only has one reflector instead of two reflectors (i.e., having the common reflector 206, but not having the top reflector 212). In particular, the first alternative resonator 202A is composed of the common reflector 206 (which is shared with the second resonator 204 vertically stacked with the first alternative resonator 202A), the first bottom electrode 216 over the common reflector 206, the first piezoelectric layer 210 over the first bottom electrode 216, and the first top electrode 214 over the first piezoelectric layer 210. For the purpose of this illustration, the common reflector 206 and the bottom reflector 242 in the first alternative resonator structure 200A are conductive reflectors. In different applications, the common reflector 206 may be replaced by the non-conductive alternative common reflector 206A, and/or the bottom reflector 242 may be replaced by the non-conductive alternative bottom reflector 242A (not shown).

FIG. 3B illustrates a second alternative resonator structure 200B, which only includes one reflector for two resonators. The second alternative resonator structure 200B includes the first alternative resonator 202A and a second alternative resonator 204A, which are vertically stacked with each other and share the common reflector 206. Both the first alternative resonator 202A and the second alternative resonator 204A reside on the substrate 208. Compared to the second resonator 204 in the first alternative resonator structure 200A, the second alternative resonator 204A in the second alternative resonator structure 200B only has one reflector instead of two reflectors (i.e., having the common reflector 206, but not having the bottom reflector 242). In particular, the second alternative resonator 204A is composed of the second bottom electrode 246 over the substrate 208, the second piezoelectric layer 240 over the second bottom electrode 246, the second top electrode 244 over the second piezoelectric layer 240, and the common reflector 206 (which is shared with the first alternative resonator 202A vertically stacked with the second alternative resonator 204A) over the second top electrode 244. For the purpose of this illustration, the common reflector 206 in the second alternative resonator structure 200B is a conductive reflector. In different applications, the common reflector 206 may be replaced by the non-conductive alternative common reflector 206A (not shown).

Figure 4:
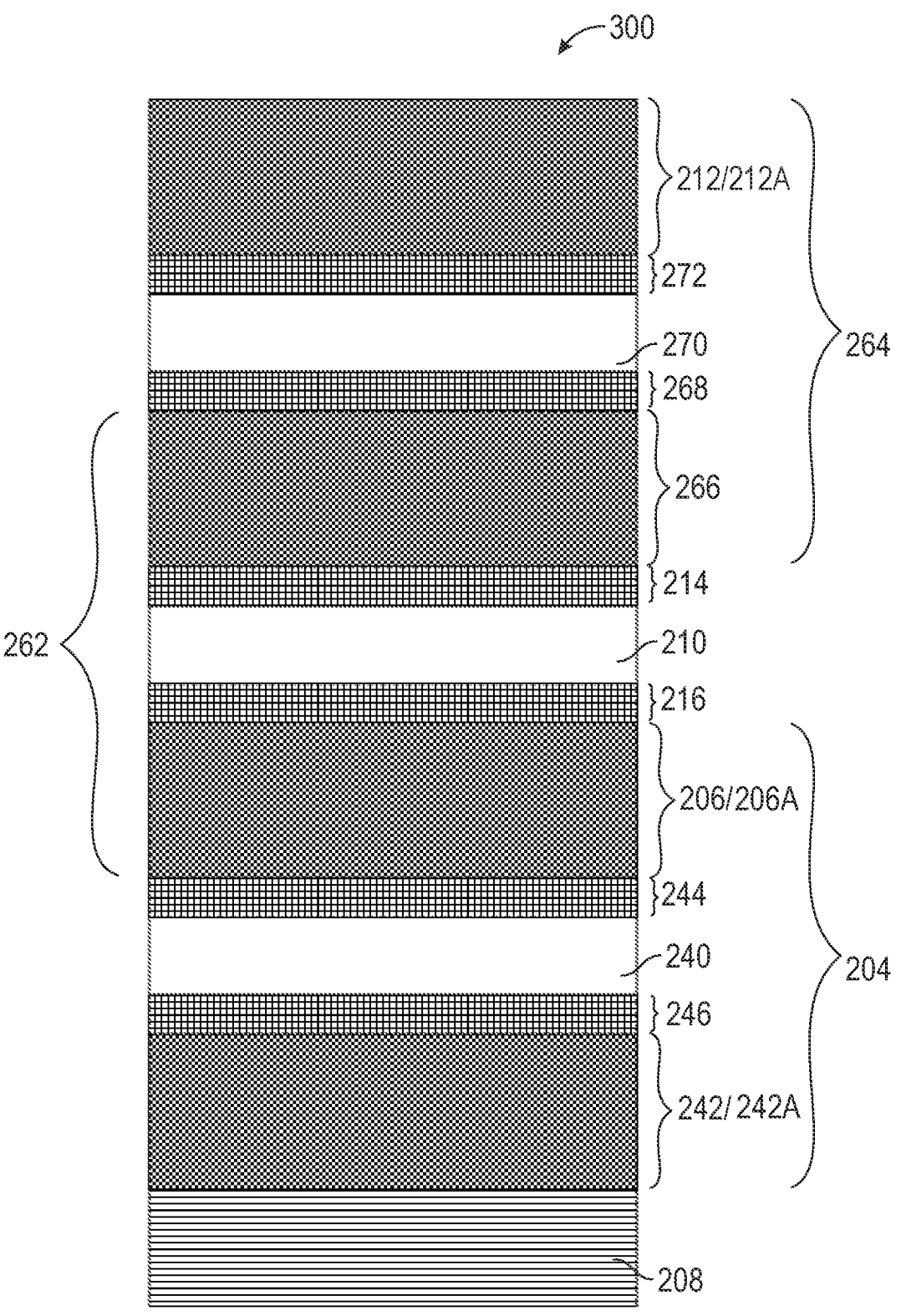
FIG. 4 illustrates an exemplary resonator structure, which includes more than two stacked resonators according to some embodiments of the present disclosure.

For some embodiments, more than two resonators can be vertically stacked. As illustrated in FIG. 4, a resonator structure 300 includes three resonators vertically stacked with two shared reflectors. In detail, the resonator structure 300 includes the second resonator 204 over the substrate 208, a middle resonator 262, and an upper resonator 264. Herein, the middle resonator 262 shares the common reflector 206 (or shares the alternative common reflector 206A) with the second resonator 204 and further includes the first bottom electrode 216 over the common reflector 206, the first piezoelectric layer 210 over the first bottom electrode 216, the first top electrode 214 over the first piezoelectric layer 210, and a second common reflector 266 over the first top electrode 214. The second common reflector 266 may have a same/similar configuration as the common reflector 206 or the alternative common reflector 206A (details of each layer are shown in FIGS. 2A-3B).

In addition, the upper resonator 264 shares the second common reflector 266 with the middle resonator 262 and further includes a bottom electrode 268 over the second common reflector 266, an upper piezoelectric layer 270 over the bottom electrode 268, a top electrode 272 over the upper piezoelectric layer 270, and the top reflector 212 (or the alternative reflector 212A) over the top electrode 272. The bottom electrode 268 and the top electrode 272 may have the same configurations as the first bottom electrode 216 and the first top electrode 214 in the resonator structure 200, respectively. The upper piezoelectric layer 270 may be formed of a piezoelectric material, such as AlN, ZnO, or the like. The first piezoelectric layer 210 of the middle resonator 262, the second piezoelectric layer 240 of the second resonator 204, and the upper piezoelectric layer 270 of the upper resonator 264 may be formed of a same or different piezoelectric material (details of each layer are shown in FIGS. 2A-3B).

Figure 5A:
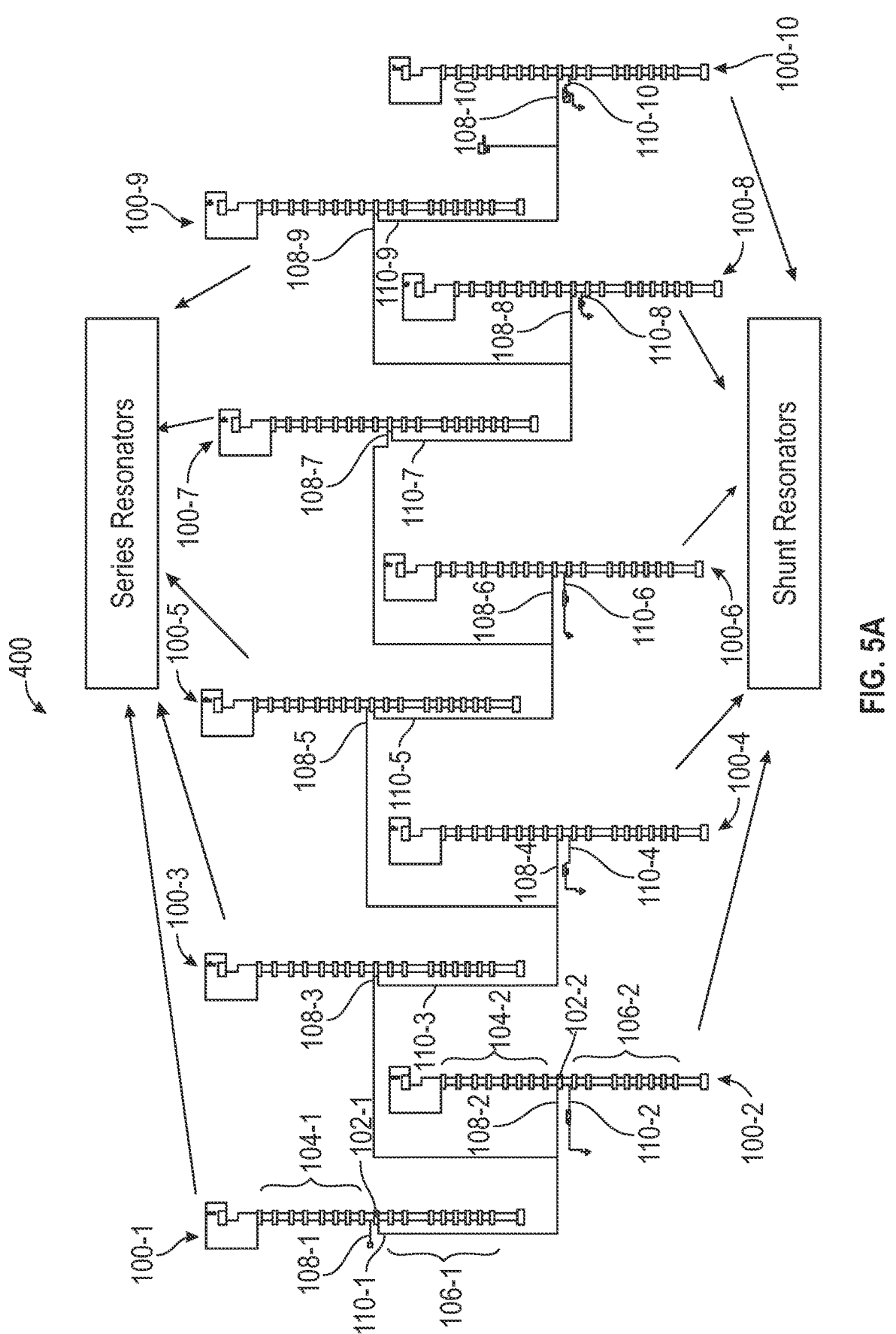
FIG. 5A illustrates a BAW filter formed by the conventional SMRs shown in FIG. 1.
Figure 5B:
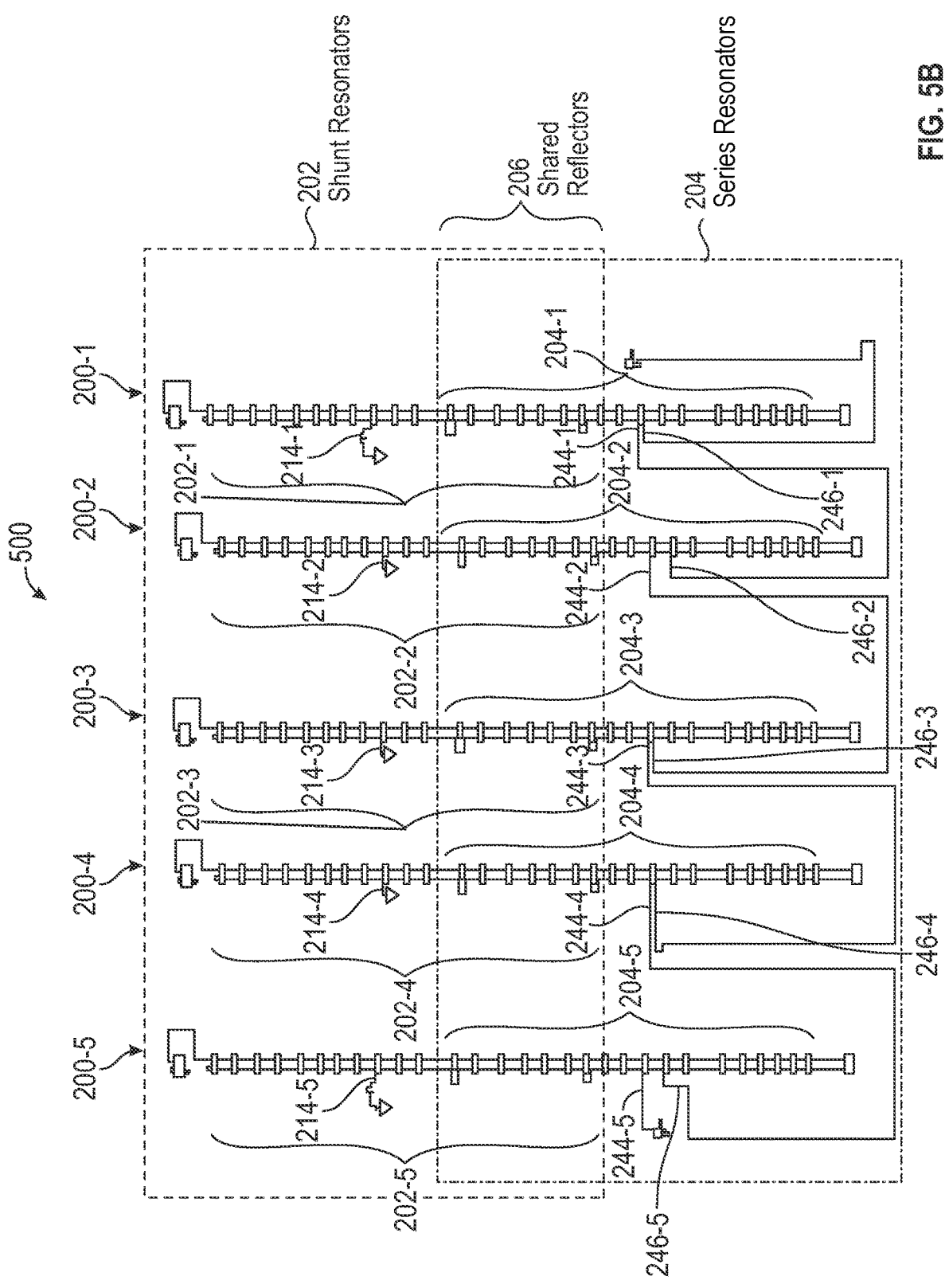
FIG. 5B illustrates a BAW filter formed by the exemplary resonator structures shown in FIG. 2A.

FIG. 5A illustrates a first BAW filter 400 formed by the conventional SMRs 100 shown in FIG. 1 and FIG. 5B illustrates a second BAW filter 500 formed by the resonator structures 200 shown in FIG. 2A. Herein, both the first BAW filter 400 and the second BAW filter 500 are composed of ten resonators and achieve a same order of filtering. However, the second BAW filter 500 consumes a much smaller device area than the first BAW filter 400.

As illustrated in FIG. 5A, the SMRs 100-1, 100-3, 100-5, 100-7, and 100-9 are series resonators, while the SMRs 100-2, 100-4, 100-6, 100-8, and 100-10 are shunt resonators. A bottom electrode 110-1 of the series SMR 100-1 is connected to a top electrode 108-3 of the series SMR 100-3, a bottom electrode 110-3 of the series SMR 100-3 is connected to a top electrode 108-5 of the series SMR 100-5, a bottom electrode 110-5 of the SMR series 100-5 is connected to a top electrode 108-7 of the series SMR 100-7, and a bottom electrode 110-7 of the series SMR 100-7 is connected to a top electrode 108-9 of the series SMR 100-9. A top electrode 108-2 of the shunt SMR 100-2 is connected to the bottom electrode 110-1 of the series SMR 100-1, and a bottom electrode 110-2 of the shunt SMR 100-2 is connected to ground. A top electrode 108-4 of the shunt SMR 100-4 is connected to the bottom electrode 110-3 of the series SMR 100-3, and a bottom electrode 110-4 of the shunt SMR 100-4 is connected to ground. A top electrode 108-6 of the shunt SMR 100-6 is connected to the bottom electrode 110-5 of the series SMR 100-5, and a bottom electrode 110-6 of the shunt SMR 100-6 is connected to ground. A top electrode 108-8 of the shunt SMR 100-8 is connected to the bottom electrode 110-7 of the series SMR 100-7, and a bottom electrode 110-8 of the shunt SMR 100-8 is connected to ground. A top electrode 108-10 of the shunt SMR 100-10 is connected to the bottom electrode 110-9 of the series SMR 100-9, and a bottom electrode 110-10 of the shunt SMR 100-10 is connected to ground.

As illustrated in FIG. 5B, each resonator structure 200 includes one shunt resonator 202 and one series resonator 204. A top electrode 244-1 of a series resonator 204-1 in a resonator structure 200-1 is connected to a bottom electrode 246-2 of a series resonator 204-2 in a resonator structure 200-2, a top electrode 244-2 of the series resonator 204-2 in the resonator structure 200-2 is connected to a bottom electrode 246-3 of a series resonator 204-3 in a resonator structure 200-3, a top electrode 244-3 of the series resonator 204-3 in the resonator structure 200-3 is connected to a bottom electrode 246-4 of a series resonator 204-4 in a resonator structure 200-4, and a top electrode 244-4 of the series resonator 204-4 in the resonator structure 200-4 is connected to a bottom electrode 246-5 of a series resonator 204-5 in a resonator structure 200-5.

Since each shunt resonator 202 and a corresponding series resonator 204 share one conductive reflector 206, each shunt resonator 202 is electrically connected to the corresponding series resonator 204 (e.g., electrically connected to a top electrode 244 of the corresponding series resonator 204). In addition, a top electrode 214-1 of a shunt resonator 202-1 in the resonator structure 200-1, a top electrode 214-2 of a shunt resonator 202-2 in the resonator structure 200-2, a top electrode 214-3 of a shunt resonator 202-3 in the resonator structure 200-3, a top electrode 214-4 of a shunt resonator 202-4 in the resonator structure 200-4, and a top electrode 214-5 of a shunt resonator 202-5 in the resonator structure 200-5 are electrically connected to ground.

It is contemplated that any of the foregoing aspects, and/or various separate aspects and features as described herein, may be combined for additional advantage. Any of the various embodiments as disclosed herein may be combined with one or more other disclosed embodiments unless indicated to the contrary herein.

Those skilled in the art will recognize improvements and modifications to the preferred embodiments of the present disclosure. All such improvements and modifications are considered within the scope of the concepts disclosed herein and the claims that follow.

What is claimed is:

1. A resonator structure comprising:
 a first resonator; and
 a second resonator, which is vertically stacked with the first resonator and shares a common reflector with the first resonator, wherein:
  the first resonator is at least composed of a top reflector, a first top electrode underneath the top reflector, a first piezoelectric layer underneath the first top electrode, and the common reflector underneath the first piezoelectric layer;
  the top reflector is a non-conductive reflector and includes alternating high acoustic impedance layers and low acoustic impedance layers over the first top electrode;
  the second resonator is at least composed of the common reflector, a second piezoelectric layer underneath the common reflector, and a second bottom electrode underneath the second piezoelectric layer; and
  the first resonator and the second resonator are acoustically isolated from each other.

2. The resonator structure of claim 1 wherein the second resonator further includes a bottom reflector underneath the second bottom electrode.

3. The resonator structure of claim 2 wherein the bottom reflector is a non-conductive reflector and includes alternating high acoustic impedance layers and low acoustic impedance layers underneath the second bottom electrode.

4. The resonator structure of claim 3 wherein:
 the high acoustic impedance layers of the bottom reflector and the high acoustic impedance layers of the top reflector are formed of W, Mo, or Pt;
 the low acoustic impedance layers of the bottom reflector and the low acoustic impedance layers of the top reflector are formed of SiO$_2$;
 a total number of the alternating high acoustic impedance layers and low acoustic impedance layers of the bottom reflector is at least five; and
 a total number of the alternating high acoustic impedance layers and low acoustic impedance layers of the top reflector is at least five.

5. The resonator structure of claim 1 wherein the common reflector is a non-conductive reflector, and the first resonator and the second resonator are electrically connected with external wiring.

6. The resonator structure of claim 5 wherein:
 the first resonator further includes a first bottom electrode residing vertically between the common reflector and the first piezoelectric layer, while the second resonator further includes a second top electrode residing vertically between the common reflector and the second piezoelectric layer; and the common reflector includes alternating high acoustic impedance layers and low acoustic impedance layers residing vertically between first bottom electrode and the second top electrode.

7. The resonator structure of claim 6 wherein:

the high acoustic impedance layers of the common reflector are formed of W, Mo, or Pt, and the low acoustic impedance layers of the common reflector are formed of $SiO_2$;

the high acoustic impedance layers of the top reflector are formed of W, Mo, or Pt, and the low acoustic impedance layers of the top reflector are formed of $SiO_2$;

a total number of the alternating high acoustic impedance layers and low acoustic impedance layers of the common reflector is at least five; and a total number of the alternating high acoustic impedance layers and low acoustic impedance layers of the top reflector is at least five.

8. The resonator structure of claim 1 wherein the first piezoelectric layer and the second piezoelectric layer are formed of different materials.

9. A resonator structure, comprising:

a first resonator; and a second resonator, which is vertically stacked with the first resonator and shares a common reflector with the first resonator, wherein:

the common reflector is a conductive reflector and includes top common vias, bottom common vias, a top common dielectric layer, a bottom common dielectric layer underneath the top common dielectric layer, and alternating high acoustic impedance layers and low acoustic impedance layers residing vertically between the top common dielectric layer and the bottom common dielectric layer;

the first resonator is at least composed of a first top electrode, a first piezoelectric layer underneath the first top electrode, a first bottom electrode underneath the first piezoelectric layer, and the common reflector underneath the first bottom electrode;

the second resonator is at least composed of the common reflector, a second top electrode underneath the common reflector, a second piezoelectric layer underneath the second top electrode, and a second bottom electrode underneath the second piezoelectric layer;

each of the top common vias extends through the top common dielectric layer and electrically connects the first bottom electrode and a top one of the high acoustic impedance layers, and each of the bottom common vias extends through the bottom common dielectric layer and electrically connects the second top electrode and a bottom one of the high acoustic impedance layers; and the first resonator and the second resonator are acoustically isolated from each other.

10. The resonator structure of claim 9 wherein:

the top common dielectric layer and the bottom common dielectric layer are formed of silicon oxide ($SiO_2$); and the high acoustic impedance layers are formed of tungsten (W), molybdenum (Mo), or platinum (Pt), and the low acoustic impedance layers are formed of aluminum (Al).

11. The resonator structure of claim 9 wherein the first resonator further includes a top reflector over the first top electrode.

12. The resonator structure of claim 11 wherein:

the top reflector is a conductive reflector and includes top vias, a top dielectric layer over the first top electrode, and alternating high acoustic impedance layers and low acoustic impedance layers over the top dielectric layer; and each of the top vias extends through the top dielectric layer and electrically connects the first top electrode and a bottom one of the high acoustic impedance layers.

13. The resonator structure of claim 11 wherein the second resonator further includes a bottom reflector underneath the second bottom electrode.

14. The resonator structure of claim 13 wherein:

the top reflector is a conductive reflector and includes top vias, a top dielectric layer over the first top electrode, and alternating first high acoustic impedance layers and first low acoustic impedance layers over the top dielectric layer;

each of the top vias extends through the top dielectric layer and electrically connects the first top electrode and a bottom one of the first high acoustic impedance layers;

the bottom reflector is a conductive reflector and includes bottom vias, a bottom dielectric layer underneath the second bottom electrode, and alternating second high acoustic impedance layers and second low acoustic impedance layers underneath the bottom dielectric layer; and each of the bottom vias extends through the bottom dielectric layer and electrically connects the second bottom electrode and a top one of the second high acoustic impedance layers.

15. The resonator structure of claim 14 wherein:

the top dielectric layer and the bottom dielectric layer are formed of $SiO_2$;

the first high acoustic impedance layers and the second high acoustic impedance layers are formed of W, Mo, or Pt; and and the first low acoustic impedance layers and the second low acoustic impedance layers are formed of Al.

16. The resonator structure of claim 9 wherein the second resonator further includes a bottom reflector underneath the second bottom electrode.

17. The resonator structure of claim 16 wherein:

the bottom reflector is a conductive reflector and includes bottom vias, a bottom dielectric layer underneath the second bottom electrode, and alternating high acoustic impedance layers and low acoustic impedance layers underneath the bottom dielectric layer; and each of the bottom vias extends through the bottom dielectric layer and electrically connects the second bottom electrode and a top one of the high acoustic impedance layers.

18. The resonator structure of claim 9 wherein the first piezoelectric layer and the second piezoelectric layer are formed of different materials.

19. A resonator structure comprising:

a first resonator;

a second resonator, which is vertically stacked with the first resonator and shares a common reflector with the first resonator; and a third resonator, which is vertically stacked with the first resonator and the second resonator, and shares a second common reflector with the second resonator, wherein:

the first resonator is at least composed of a first top electrode, a first piezoelectric layer underneath the first top electrode, and the common reflector underneath the first piezoelectric layer;

the second resonator is at least composed of the common reflector, the second piezoelectric layer underneath the common reflector, the second bottom electrode underneath the second piezoelectric layer, and the second common reflector underneath the second bottom electrode;

the third resonator is at least composed of the second common reflector, a third piezoelectric layer underneath the second common reflector, and a third bottom electrode underneath the third piezoelectric layer; and the first resonator, the second resonator, and the third resonator are acoustically isolated from each other.

\*    \*    \*    \*    \*